US006697911B2

(12) United States Patent
Srinivasan et al.

(10) Patent No.: US 6,697,911 B2
(45) Date of Patent: *Feb. 24, 2004

(54) SYNCHRONOUS CONTENT ADDRESSABLE MEMORY

(75) Inventors: Varadarajan Srinivasan, Los Altos Hills, CA (US); Bindiganavale S. Nataraj, Cupertino, CA (US); Sandeep Khanna, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 09/778,170

(22) Filed: Feb. 6, 2001

(65) Prior Publication Data

US 2001/0005876 A1 Jun. 28, 2001

Related U.S. Application Data

(62) Division of application No. 08/967,314, filed on Oct. 30, 1997, now Pat. No. 6,199,140.

(51) Int. Cl.[7] .............................................. G06F 12/02
(52) U.S. Cl. ......................................... 711/108; 365/49
(58) Field of Search ............................. 711/108; 380/9, 380/5; 365/49, 226

(56) References Cited

U.S. PATENT DOCUMENTS

| 3,257,646 A | 6/1966 | Roth |
| 3,353,159 A | 11/1967 | Lee, III |
| 3,602,899 A | 8/1971 | Lindquist et al. |
| 3,675,211 A | 7/1972 | Raviv |
| 3,685,020 A | 8/1972 | Meade |
| 3,705,390 A | 12/1972 | Mundy |
| 3,800,286 A | 3/1974 | Brown |
| 3,868,642 A | 2/1975 | Sachs |
| 4,112,502 A | 9/1978 | Scheuneman |
| 4,244,033 A | 1/1981 | Hattori |
| 4,472,805 A | 9/1984 | Wacyk et al. |
| 4,523,301 A | 6/1985 | Kadota et al. |
| 4,646,271 A | 2/1987 | Uchiyama et al. |

(List continued on next page.)

FOREIGN PATENT DOCUMENTS

| EP | 0 660 332 A | 12/1993 |
| JP | 63276645 A | 11/1988 |
| JP | 08167295 | 6/1996 |

OTHER PUBLICATIONS

Motorola Semiconductor Technical Data, "Advance Information 16K x 64 CAM" MCM69C432, Jan. 1996, pp. 4 pages total.

(List continued on next page.)

*Primary Examiner*—B. James Peikari
(74) *Attorney, Agent, or Firm*—Blakely, Sokoloff, Taylor & Zafman LLP

(57) ABSTRACT

A content addressable memory (CAM) device. The CAM device is a synchronous device that may perform all of the following operations all in one clock cycle: (1) receive comparand data from a comparand bus; (2) receive an instruction from an instruction bus instructing the CAM device to compare the comparand data with a first group of CAM cells in a CAM array; (3) perform the comparison of the comparand data with the first group of CAM cells; (4) generate a match address for a location in the CAM array that stores data matching the comparand data; (5) access data stored in a second group of the CAM cells in the CAM array, wherein the second group of CAM cells may store data associated with the matched location; and (6) output to an output bus the match address, the data stored in the second group of CAM cells, and/or status information corresponding to the matched address or the second group of CAM cells. The status information may include a match flag, multiple match flag, full flag, skip bit, empty bit, or a device identification for the CAM device.

14 Claims, 10 Drawing Sheets

U.S. PATENT DOCUMENTS

| | | | |
|---|---|---|---|
| 4,656,626 A | | 4/1987 | Yudichak et al. |
| 4,670,858 A | | 6/1987 | Almy |
| 4,747,080 A | | 5/1988 | Yamada |
| 4,758,982 A | | 7/1988 | Price |
| 4,780,845 A | | 10/1988 | Threewitt |
| 4,785,398 A | | 11/1988 | Joyce et al. |
| 4,791,606 A | | 12/1988 | Threewitt et al. |
| 4,813,002 A | | 3/1989 | Joyce et al. |
| 4,845,668 A | | 7/1989 | Sano et al. |
| 4,897,813 A | * | 1/1990 | Kumbasar ................. 365/49 |
| 4,903,234 A | | 2/1990 | Sakuraba et al. |
| 4,928,260 A | | 5/1990 | Chuang et al. |
| 4,958,377 A | | 9/1990 | Takahashi |
| 4,959,811 A | | 9/1990 | Szczepanek |
| 4,975,873 A | | 12/1990 | Nakabayashi et al. |
| 4,996,666 A | | 2/1991 | Duluk, Jr. |
| 5,010,516 A | | 4/1991 | Oates |
| 5,014,195 A | | 5/1991 | Farrell et al. |
| 5,036,486 A | | 7/1991 | Noguchi et al. |
| 5,051,948 A | | 9/1991 | Watabe et al. |
| 5,053,991 A | | 10/1991 | Burrows |
| 5,072,422 A | | 12/1991 | Rachels |
| 5,107,501 A | | 4/1992 | Zorian |
| 5,111,427 A | | 5/1992 | Kobayashi et al. |
| 5,226,005 A | | 7/1993 | Lee et al. |
| 5,265,100 A | | 11/1993 | McClure et al. |
| 5,267,213 A | * | 11/1993 | Sung et al. ................. 365/226 |
| 5,319,589 A | | 6/1994 | Yamagata et al. |
| 5,339,268 A | | 8/1994 | Machida |
| 5,383,146 A | | 1/1995 | Threewitt |
| 5,396,449 A | * | 3/1995 | Atallah et al. ............... 365/49 |
| 5,414,704 A | | 5/1995 | Spinney |
| 5,428,565 A | * | 6/1995 | Shaw ........................ 365/49 |
| 5,440,709 A | | 8/1995 | Edgar |
| 5,440,715 A | | 8/1995 | Wyland |
| 5,446,685 A | * | 8/1995 | Holst ........................ 365/49 |
| 5,454,094 A | | 9/1995 | Montoye |
| 5,455,576 A | | 10/1995 | Clark, II et al. |
| 5,469,161 A | | 11/1995 | Bezek |
| 5,469,378 A | * | 11/1995 | Albon et al. ................. 365/49 |
| 5,485,418 A | | 1/1996 | Hiraki et al. |
| 5,485,526 A | | 1/1996 | Tobin |
| 5,490,102 A | | 2/1996 | Jubran |
| 5,491,703 A | | 2/1996 | Barnaby et al. |
| 5,513,134 A | | 4/1996 | Cooperman et al. |
| 5,517,441 A | | 5/1996 | Dietz et al. |
| 5,598,115 A | * | 1/1997 | Holst ........................ 326/119 |
| 5,621,677 A | | 4/1997 | Jones |
| 5,649,149 A | | 7/1997 | Stormon et al. |
| 5,706,224 A | | 1/1998 | Srinivasan et al. ........... 365/49 |
| 5,758,148 A | | 5/1998 | Lipovski |
| 5,818,873 A | | 10/1998 | Wall et al. |
| 5,841,874 A | * | 11/1998 | Kempke et al. ............. 713/160 |
| 5,860,085 A | * | 1/1999 | Stormon et al. ............. 711/108 |
| 5,870,324 A | * | 2/1999 | Helwig et al. ................ 365/49 |
| 5,893,931 A | | 4/1999 | Peng et al. |
| 5,905,668 A | | 5/1999 | Takahashi et al. |
| 5,930,359 A | * | 7/1999 | Kempke et al. ............. 713/160 |
| 5,940,852 A | | 8/1999 | Rangasayee et al. |
| 5,946,704 A | | 8/1999 | Yoneda et al. |
| 6,148,364 A | | 11/2000 | Srinivasan et al. |

OTHER PUBLICATIONS

GEC Plessey Semiconductors, "P2800 Multi–port Content Addressable Memory Functional Product Specification GPS–FPS–2800/12", Jan. 1996, pp. 1–102.

Advanced Micro Devices, "Final Am99C10A 256 x 48 Content Addressable Memory" Publication No. 08125, Rev. G, Dec. 1992, pp. 1–21.

Music Semiconductors, "MU9C2480 LANCAM Preliminary Data Sheet", Aug. 25, 1995, pp. 1–24.

GEC Plessey Semiconductors Preliminary Information, "P2800 2K x 64 Bit Multi–Port Content Addressable Memory", Feb. 1997, pp. 1–15.

Music Semiconductor, The MU9C1480 LANCAM Handbook, Rev. 3, Nov. 1994, pp. 1–1 through 7–12.

Soo–Ik Chae, et al., "Content–Addressabale Memory for VLSI Pattern Inspection", IEEE Journal of Solid–State Circuits, vol. 23, No. 1, Feb. 1988, pp. 74–78.

Yong–Chul Shin, et al., "A Special–Purpose Content Addressable Memory Chip for Real–Time Image Processing", IEEE Journal of Solid–State Circuits, vol. 27, No. 5, May 1992, pp. 737–744.

Sergio R. Ramirez–Chavez, "Encoding Don't Cares in Static and Dynamic Content–Addressable Memories", Transaction Briefs IEEE Transactions on Circuits and System–II: Analog and Digital Signal Processing, vol. 39, No. 8, Aug. 1992, pp. 575–578.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron., vol. E76–C, No. 11, Nov. 1993, pp. 1545–1554.

Takeshi Ogura, et al., "A 4–kbit Associative Memory LSI", IEEE Journal of Solid–State Circuits, vol. SC–20, No. 6, Dec. 1985, pp. 1277–1281.

Hiroshi Kadota, et al., "An 8–kbit Content–Addressable and Reentrant Memory", IEEE Journal of Solid–State Circuits, vol. SC–20, No. 5, Oct. 1985, pp. 951–956.

Simon R. Jones, et al., "A 9–kbit Associative Memory for High–Speed Parallel Processing Applications", IEEE Journal of Solid–State Circuits, vol. 23, No. 2, Apr. 1988, pp. 543–548.

Anthony J. McAuley, et al., "A Self–Testing Reconfigurable CAM", IEEE Journal of Solid–State Circuits, vol. 26, No. 3, Mar. 1991, pp. 257–261.

PCT International Search Report–PCT/US 98/22000—International Filing Date Oct. 15, 1998.

Masao Akata, "A Scheduling Content–Addressable Memory for ATM Space–Division Switch Control", IEEE International Solid State Circuits Conference, Feb. 1991, New York.

Ghose et al., "Response Pipelined CAM Chips: The First Generation and Beyond", 7th International conference on VLSI Design, Jan. 1994, pp. 365–368.

Music Semiconductors, "MU9C1480 LANCAM" Advance Information, Mar. 22, 1990, pp. 1–11.

Music Semiconductors, "MU9C1480 LANCAM™ " Preliminary Specificaiton, Jan. 15, 1991, Rev O, pp. 1 page total.

U.S. patent application No. 09/111,364, entitled "Method and Apparatus for Performing A Read Next Highest Priority match Instruction in a Content Addressable Memory Device" filed on Jul. 6, 1998, pp. 58 total.

U.S. patent application No. 09/076,337, entitled "Method and Apparatus for Implementing a Learn Instruction in a Content Addressable Memory Device", filed on May 11, 1998, pp. 64 total.

U.S. patent application No. 09/076,336, entitled "Method and Apparatus for Implementing a Learn Instruction in a Depth Cascaded Content Addressable Memory System", filed on May 11, 1998, pp. 64 total.

KLSI, "Address Processor" KE5B064H series—Dual Port and Fixed Table Type–, Version 1.0.1, published approximately late 1995 or early 1996, pp. 1–1 through 14–1.

KLSI, "KE5B064A1 Address Processor" Version 2.0.2, published approximately late 1995 or early 1996, pp. 1–1 through 12–1.

Landrock et al., "Associative Storage Module", IBM Technical Disclosure Bulletin, vol. 25, No. 5, Oct. 1982, pp. 2341–2342.

* cited by examiner

| Bit 63 ..... Bit 52 | Bit 51 ..... Bit 40 | Bit 39 ..... Bit 37 | Bit 36 | Bit 35 | Bit 34 | Bit 33 | Bit 32 | Bit 31 ..... Bit 0 |
|---|---|---|---|---|---|---|---|---|
| Match Address | Device ID | Reserved | MF | MMF | FF | Skip | Empty | Data from Cam Array 104 |

FIG. 10

| Bit 63 ..... Bit 52 | Bit 51 ..... Bit 48 | Bit 47 ..... Bit 0 |
|---|---|---|
| Match Address | Device ID | Data from Cam Array 104 |

FIG. 11

SYNCHRONOUS CONTENT ADDRESSABLE MEMORY

The present application is a divisional application of U.S. patent application Ser. No 08/967,314 filed on Oct. 30, 1997 now U.S. Pat. No. 6,199,140.

FIELD OF THE INVENTION

The present invention relates generally to content addressable memory (CAM) devices.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. If a match exists, the CAM device indicates the match by asserting a match flag. Multiple matches may also be indicated by asserting a multiple match flag. The CAM device typically includes a priority encoder to translate the matched location into a match address or CAM index and outputs this address to a status register.

Each CAM cell conventionally includes a comparator and a random access memory (RAM) element. The CAM array may be partitioned into separate segments in which one segment stores CAM or compare data to be compared with the comparand data, and another segment stores associated RAM data corresponding to each of the CAM or compare locations. Once a match between the CAM data and the comparand data is determined, the associated RAM data for the matched location may be output to a status register. The RAM data and/or the CAM data may then be read from the status register.

Conventional CAM devices require more than one clock cycle to perform a write and compare instruction. For example, a typical write and compare instruction requires at least three clock cycles: a first clock cycle to present a compare instruction and/or comparand data to the CAM device, perform the search, and generate a match flag and multiple match flag signal; a second clock cycle to instruct the CAM device to output the matching CAM address or index; and, a third clock cycle to instruct the CAM device to output the associated data and status information (e.g., skip bit, empty bit, full flag, as well as, match and multiple match flags) for the matched location. With conventional cycle times generally running at 100 nanoseconds (ns), it requires at least 300 ns to complete this process. This generally limits the search rate of conventional CAM devices to approximately 1 to 3 million searches per second. This also generally limits the number of ports, segments, or devices that can be supported by a conventional CAM device in a switch or router environment.

The multi-clock cycle process has generally been required due to the architecture of conventional CAM devices. Most CAM devices include a general purpose bi-directional bus that keeps the pin count of the CAM devices to a minimum (e.g., 44 pins). The bi-directional bus is used to load comparand data and instructions into the CAM device. The bi-directional bus is also used to output the matched address, associated data, and status bits from a status register in the CAM device. Because this bus is shared with so many input and output functions, it requires many clock cycles to multiplex data on the bus.

CAM devices that have separated the general purpose bi-directional bus into a data input bus and a data output bus, still require at least three clock cycles to perform the write and compare operation described above, namely: one clock cycle to load the write and compare instruction and/or load the comparand data and perform the comparison with CAM array; one clock cycle to access the associated data; and, one clock cycle to instruct the CAM device to output the match address, associated data, and/or status information.

As applications for CAM devices increase in speed, there has been a desire for faster CAM devices that have shorter search times, or preferably, can execute a write and compare instruction in a fewer number of clock cycles. For example, it is desirable to have a CAM device that can be used as an address filter or address translator in an ethernet switch or router that operates at data rates of 100 Megabits per second (Mb/s) to 1 Gigabits per second (Gb/s). It is also desirable to have a CAM device that can be used to implement fast routing tables in Internet Protocol (IP) switches. As the number of ports, segments, or devices that are supported by the switches or routers increases, the time required for the supporting CAM device to perform a write and compare operation (e.g., address filter or translation operation) decreases. For example, to support a 1 Gb/s ethernet switch, a CAM device supporting approximately three ports should advantageously be able to perform a single write and compare instruction in approximately 100 ns or faster. A CAM device supporting approximately six ports should advantageously be able to perform a single write and compare instruction in approximately 50 ns or faster.

SUMMARY OF THE INVENTION

A content addressable memory (CAM) device is disclosed. The CAM device is a synchronous device that may perform all of the following operations in one clock cycle: (1) receive comparand data from a comparand bus; (2) receive an instruction from an instruction bus instructing the CAM device to compare the comparand data with a first group of CAM cells in a CAM array; (3) perform the comparison of the comparand data with the first group of CAM cells; (4) generate a match address for a location in the CAM array that stores data matching the comparand data; (5) access data stored in a second group of CAM cells in the CAM array, wherein the second group of CAM cells may store data associated with the matched location; and (6) output to an output bus the match address, the data stored in the second group of CAM cells, and/or status information corresponding to the matched address or the second group of CAM cells. The status information may include a match flag, multiple match flag, full flag, skip bit, empty bit, or a device identification for the CAM device.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 10 is one embodiment of the signals output onto the ADS BUS of FIG. 1; and

FIG. 11 is another embodiment of the signals output onto the ADS BUS of FIG. 1.

DETAILED DESCRIPTION

Figure 1:
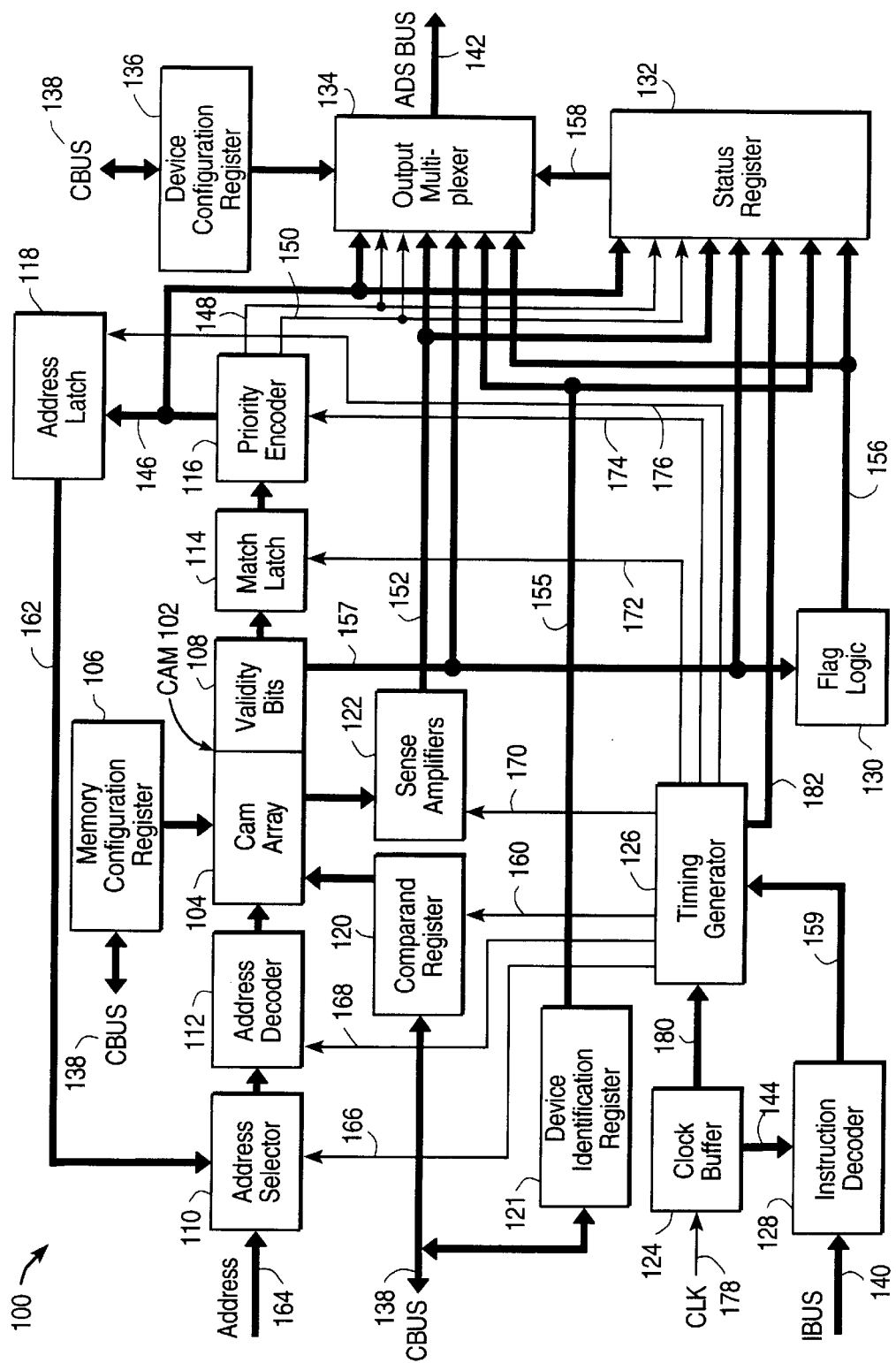
FIG. 1 is a block diagram of one embodiment of a CAM device according to the present invention.

A content addressable memory (CAM) device is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

The CAM device of the present invention is a synchronous device that has an instruction bus for receiving instructions, a separate comparand bus for receiving comparand data to be compared with one or more CAM cells of a CAM array, and a separate associated data and status bits bus. The associated data and status bits bus may simultaneously or individually output: a match address or CAM index for a location of the CAM array that matches the comparand data; data stored in one or more of the CAM cells of the CAM array, wherein the data is associated with the matched address; and status information corresponding to the matched address or associated data. The status information may include a match flag, multiple match flag, full flag, skip bit, empty bit, or device identification information for the CAM device.

The CAM device may perform, in a single clock cycle (i.e., a flow through mode), a write and compare instruction that causes the CAM device to: (1) receive comparand data from the comparand bus; (2) receive an instruction from the instruction bus instructing the CAM device to compare the comparand data with a first group of CAM cells in a CAM array; (3) perform the comparison of the comparand data with the first group of CAM cell(s); (4) generate a match address if a location in the CAM array stores data matching the comparand data; (5) access data stored in a second group of CAM cells corresponding to the matched location in the CAM array, wherein the accessed data is associated with the matched address; and (6) output the matched address, the data stored in the second group of CAM cells, and/or the status information to associated data and status bits bus.

The single cycle may have any cycle time. For one embodiment, the single cycle time may be approximately 25 ns and the CAM device may have a search rate of approximately 35 to 45 million searches per second. Thus, the present invention may be very useful in a high-speed (e.g., 100 Mb/s or 1 Gb/s) network bridge or router environment.

For example, the CAM device of the present invention may support eight or more ports, segments, or devices in a high-speed ethernet switch or router environment having, for example, a data rate of 1 Gb/s. The CAM device of the present invention may store destination addresses of data packets sent between the segments, ports, or devices in the network.

FIG. 1 shows CAM device 100 according to one embodiment of the present invention. CAM device 100 includes three separate ports coupled to three separate buses. The first port is coupled to a comparand bus (CBUS) 138 that may be a bi-directional bus used to provide comparand data to comparand register 120. CBUS 138 may also be used to access device configuration register 136, status register 132, device identification register 121, memory configuration register 106, CAM 102, and one or more mask registers (not shown). CBUS 138 may be any size to accommodate any number of bits. For one embodiment, CBUS 138 is a 64-bit bus. The first port may have input buffers or registers coupled to CBUS 138.

The second port is coupled to an instruction bus (IBUS) 140 that is used to provide instructions to instruction decoder 128. Instructions may be clocked into instruction decoder 128 from IBUS 140 by one or more clock signals output from clock buffer 124 to bus 144. IBUS 140 may be any size to accommodate any number of bits and any number of instructions. For one embodiment, IBUS 140 is 14 bits wide to accommodate $2^{14}$ unique possible binary coded instructions. Other encodings may be used. The second port may have input buffers or registers coupled to IBUS 140.

Clock buffer 124 may buffer the external clock signal CLK 178 and provide one or more clock signals to timing generator 126 via bus 180, and may provide one or more clock signals to instruction decoder 128 via bus 144. Clock buffer 124 may also generate clock signals having varying phases and frequencies.

The third port is coupled to an associated data and status bit bus (ADS BUS) 142 that may output matched address data, data from CAM array 104 corresponding to the matched address, and/or status information. ADS BUS 142 may be any size to accommodate any number of bits. For one embodiment, ADS BUS 142 is a 64-bit bus. The third port may have output buffers or registers coupled to ADS BUS 142.

Output multiplexer 134 provides data to ADS BUS 142. Output multiplexer 134 may include output buffers, one or more multiplexers, a selector circuit, registers, or latches. Output multiplexer 134 may receive a matching CAM address or index from priority encoder 116 via bus 146, and may also receive data stored in CAM array 104 via sense amplifiers 122 and bus 152. Additionally, output multiplexer 134 may receive status information including a match flag signal (MF) from priority encoder 116 via line 148, a multiple match flag signal (MMF) from priority encoder 116 via line 150, a full flag signal (FF) from flag logic 130 via line 156, device identification information from device identification register 121 via bus 155, and/or validity bits 108 via bus 157. The status information will be described in more detail below. Output multiplexer 134 may alternatively or additionally receive the matching CAM address, data stored in CAM array 104 corresponding to the matching CAM address, and/or the status information from status register 132 via bus 158. Configuration register 136 may store one or more programmable bits that may control whether output multiplexer 134 outputs the matching CAM address, CAM array data, and status information from status register 132 (e.g., in a pipelined mode) or from the other circuit elements (e.g., in a single cycle flow through mode). Status register 132 may comprise one or more registers.

CAM device 100 may also include flag logic 130 that may generate a full flag (FF) signal on lines 156 in response to validity bits 108 on bus 157. Flag logic 130 may also generate a match flag signal and a multiple match flag signal on lines 156. The flag(s) may be coupled to output multiplexer 134 and/or status register 132.

CAM device 100 may also include device identification register 121 that may store device identification information that identifies CAM device 100 from other CAM devices in a system. The device identification information may comprise any number of bits or signals. For one embodiment, the device identification information is 16 bits of binary encoded information. Any other encoding format may be used. The device identification information may also be provided to status register 132.

CAM device 100 also includes CAM 102. CAM 102 includes a CAM array 104 that may be organized in any number of rows and columns of CAM cells. CAM 102 may also include validity bits 108 that store information about corresponding locations in CAM array 104. For example, the validity bits for a given row or location in CAM array 104 may include a skip bit and an empty bit. The skip bit may indicate that a particular location in CAM array 104 should be skipped when performing a compare operation with comparand data stored in comparand register 120. The empty bit may indicate that a corresponding location in CAM array 104 is empty. The validity bits also group the CAM cells into four sates as indicated in Table 1. A comparison operation may compare comparand data against any of the locations in CAM array 104 that correspond to a given state.

TABLE 1

| SKIP | EMPTY | STATE |
|------|-------|-------|
| 0 | 0 | VALID |
| 0 | 1 | EMPTY |
| 1 | 0 | SKIP |
| 1 | 1 | RAM |

Validity bits 108 may be provided (e.g., through sense amplifiers) to output multiplexer 134, status register 132, and/or flag logic 130 via bus 157. Alternatively, validity bits 108 may be generated or decoded in response to a decoded instruction output by instruction decoder 128.

Figure 2:
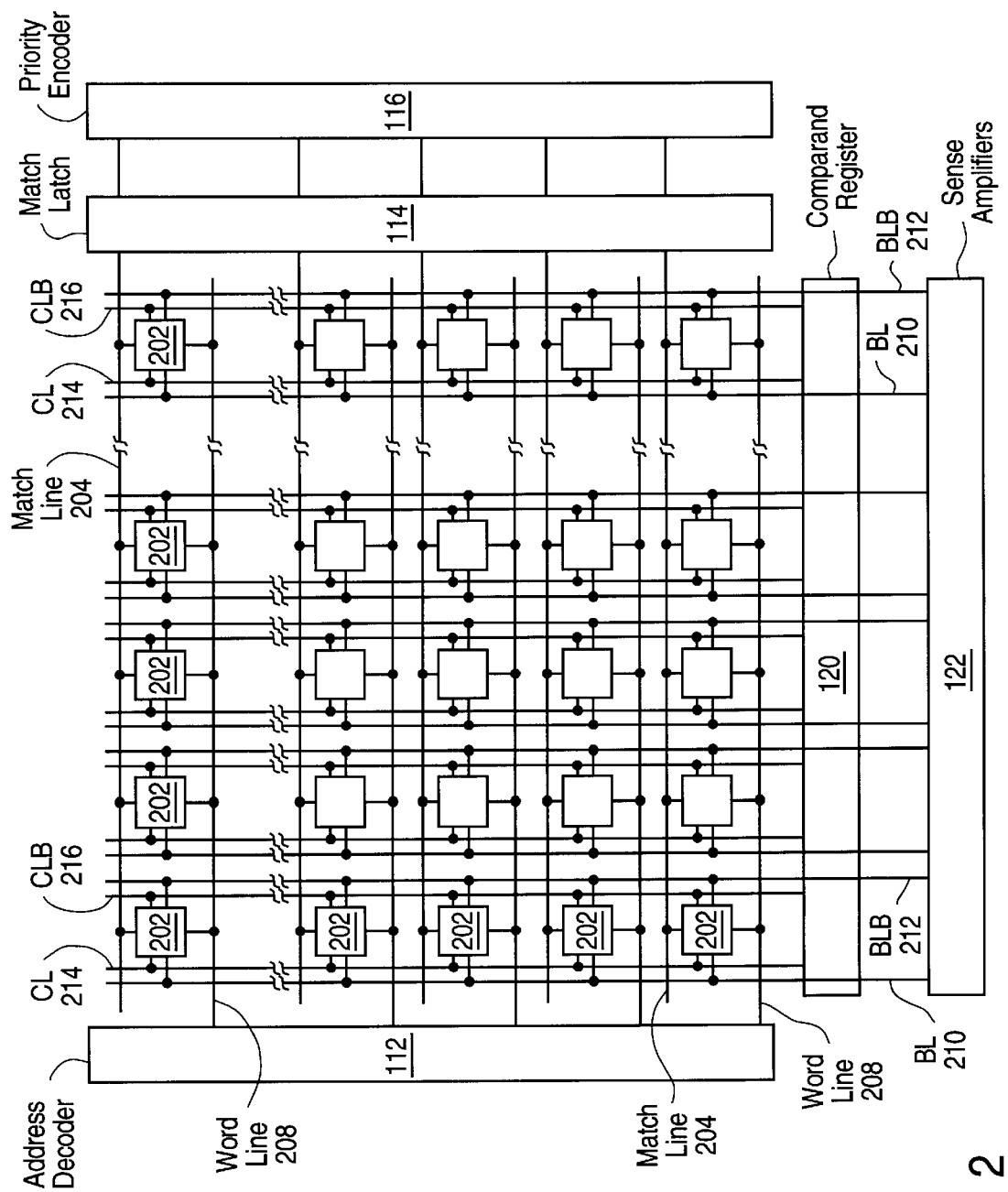
FIG. 2 is block diagram of one embodiment of the CAM array of FIG. 1.

FIG. 2 shows one embodiment of CAM array 102 having a plurality of CAM cells 202 organized in any number of rows and columns. For one embodiment, CAM array 102 may include approximately 4 k (i.e., 4096) rows and approximately 64 columns of CAM cells 202. For another embodiment, CAM array 102 may include approximately 2 k (i.e., 2048) rows and approximately 128 columns of CAM cells 202. The validity bits may also be included in additional rows and columns of CAM cells 202.

Each row of CAM cells 202 is coupled to a match line 204 and a word line 208. Each word line 208 is driven by address decoder 112 to select one or more of CAM cells 202 for writing or reading. Each match line 204 is coupled to match latch 114 that latches the match results of a comparison operation. An individual match line will indicate a match only if all of the CAM cells 202 (actually compared) in that row match the comparand data. The latch results are then provided to priority encoder 116 which generates an address corresponding to at least one of the matched locations. For one embodiment, the matched address is the highest priority match address. The highest priority match address may be the lowest numbered address, the highest numbered address, or any other selected address. Alternatively, the match address may be the lowest priority match address, or any other predetermined priority.

Each column of CAM cells is coupled to a bit line (BL) 210, a complementary bit line (BLB) 212, a compare line (CL) 214, and a complementary compare line (CLB) 216. BL 210 and BLB 212 are coupled to sense amplifiers 122 that may enable data to be read from or written to CAM cells 202. CL 214 and CLB 216 are coupled to comparand register 120 and provide comparand data to CAM cells 202 for comparison purposes. For alternative embodiments, any other CAM array architecture may be used. For example, CAM array 102 may not include CL 214 and CLB 216; rather, BL 210 and BLB 212 may be coupled to comparand register 120 and may be used to perform a comparison with data stored in CAM cells 202 as generally known in the art. For example, in the first part of a compare cycle, compare data may be provided onto BL 210 and BLB 212 from comparand register 120. In the second part of the compare cycle, BL 210 and BLB 212 may be driven with data to be output from CAM array 104.

Figure 3:
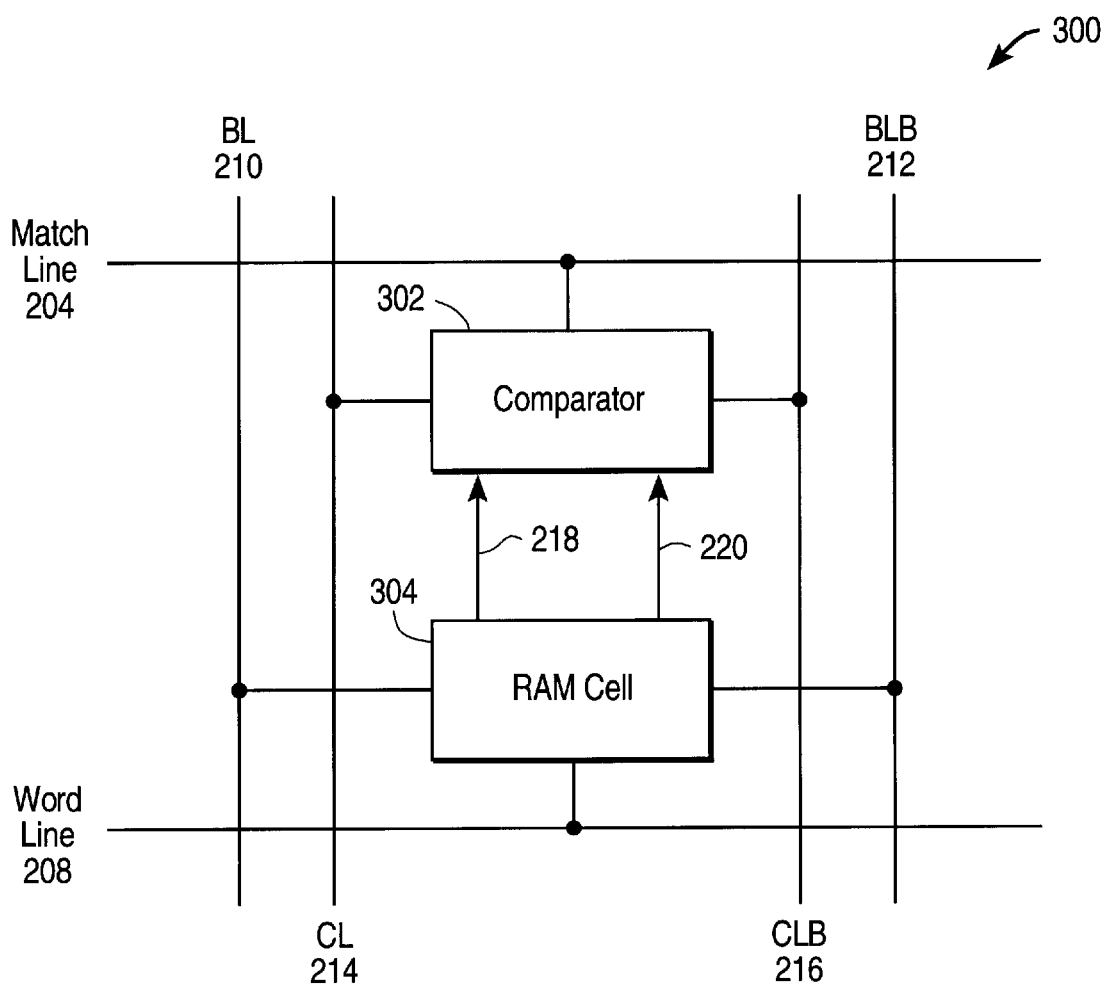
FIG. 3 is a block diagram of one embodiment of a CAM cell.

FIG. 3 shows CAM cell 300 that is one embodiment of a CAM cell 202. CAM cell 300 includes comparator 302 and RAM cell 304. RAM cell 304 is coupled to BL 210, BLB 212, and word line 208, and may be any type of RAM cell. When RAM cell 304 is selected by word line 208, data may be read from or written to RAM cell 304 via bit lines BL 210 and BLB 212. Comparator 302 is coupled to RAM cell 304, CL 214, CLB 216, and match line 204. Comparator 302 may compare data from comparand register 120 (supplied on CL 214 and CLB 216) with data stored in RAM cell 304 (supplied on lines 218 and 220). Comparator 302 may output the comparison result to match line 204. Comparator 302 may be any type of comparison circuit including an exclusive OR (XOR) or exclusive NOR (XNOR) gate. The comparison and read functions of CAM cell 300 may be performed simultaneously or sequentially. In alternative embodiments (e.g., CL 214 and CLB 216 omitted), the comparison and read functions may be performed sequentially. It will be appreciated that numerous other CAM cells may be used for CAM cells 202.

Figure 4:
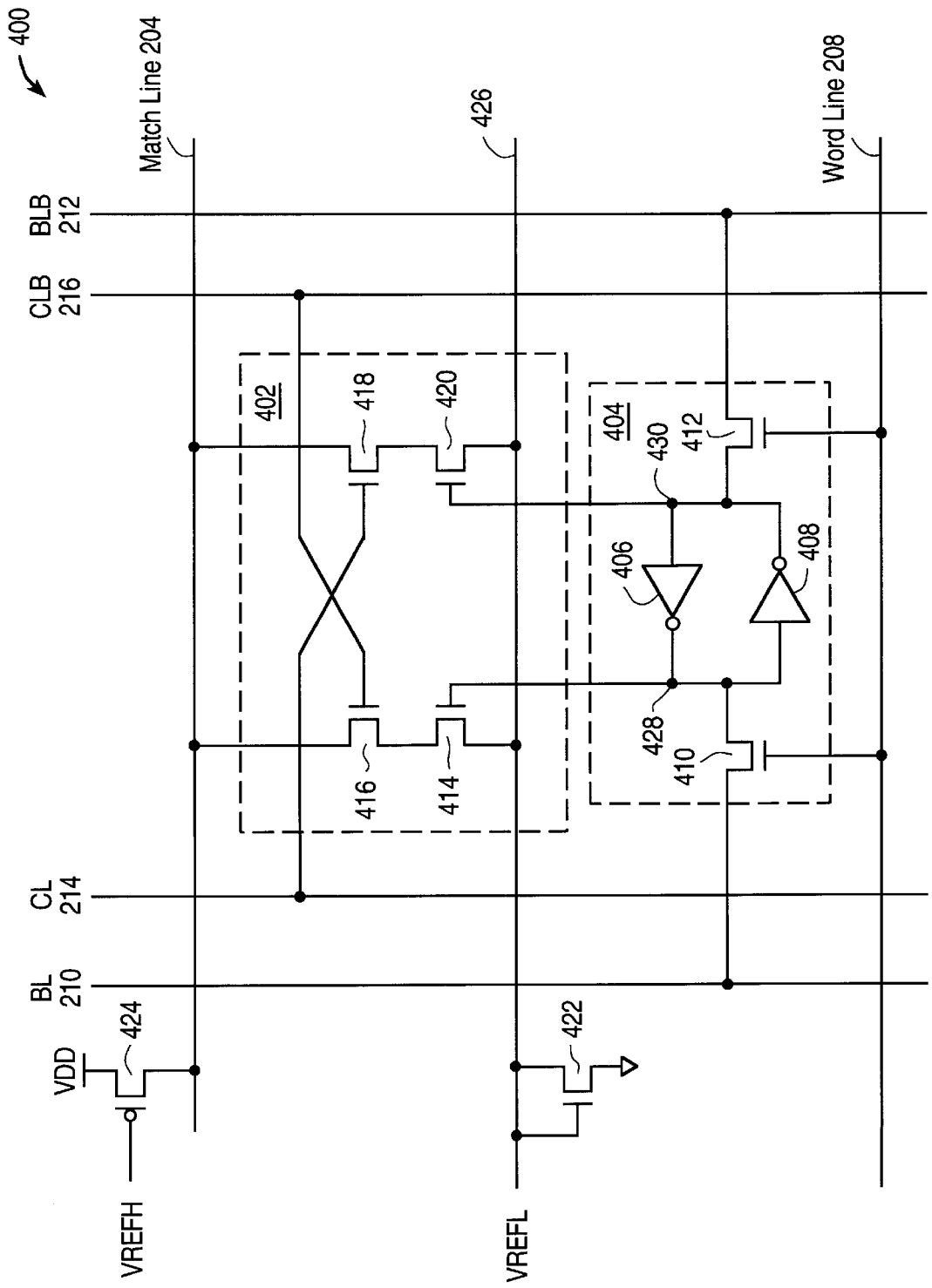
FIG. 4 is one embodiment of the CAM cell of FIG. 3.

FIG. 4 shows CAM cell 400 that is one embodiment of CAM cell 300 of FIG. 3 and/or one embodiment of a CAM cell 202 of FIG. 2. It will be appreciated that other CAM cells may be used to form CAM cell 300 and/or CAM cell 202. CAM cell 400 includes a RAM cell 404 and a comparator 402. RAM cell 404 includes cross-coupled inverters 406 and 408 coupled to nodes 428 and 430. Inverters 406 and 408 may be any type of inverters including NMOS, PMOS, or CMOS inverters with active or passive loads. RAM cell 404 also includes pass gates 410 and 412. Pass gate 410 may be an NMOS transistor having its source (drain) coupled to node 428, its drain (source) coupled to BL 210, and its gate coupled to word line 208. Pass gate 412 may be an NMOS transistor having its source (drain) coupled to node 430, its drain (source) coupled to BLB 212, and its gate coupled to word line 208. When word line 208 is selected (e.g., pulled to a high logic state), pass gate 410 is enabled to transfer data between node 428 and BL 210, and pass gate 412 is enabled to transfer data between node 430 and BLB 212.

Comparator 402 includes transistors 414, 416, 418, and 420. Transistor 414 has its gate coupled to node 428, its source coupled to line 426, and its drain coupled to the source of transistor 416. Transistor 416 has its drain coupled to match line 204, and its gate coupled to CLB 216. Transistor 420 has its gate coupled to node 430, its source coupled to line 426, and its drain coupled to the source of transistor 418. Transistor 418 has its drain coupled to match line 204, and its gate coupled to CL 214. Line 426 may be driven to a voltage VREFL of approximately one threshold voltage above ground (e.g., from approximately 0.6 volts to approximately 0.8 volts) due to the diode configuration of NMOS transistor 422 having its source coupled to ground, and its drain and gate coupled to line 426. One transistor 422 may be used for more than one CAM cell in CAM array 104. Alternatively, VREFL may be driven to approximately zero volts to approximately one volt by a reference voltage generator or other circuitry. For an alternative embodiment, line 426 may be directly connected to ground.

CAM cell 400 may also include PMOS transistor 424 that may pull match line 204 towards VDD when there is no match between data stored in RAM cell 404 and comparand data provided on compare lines CL 214 and CLB 216. PMOS transistor 424 has its source coupled to VDD, its drain coupled to match line 204, and its gate coupled to a reference voltage VREFH. VREFH may be approximately one threshold drop below VDD (e.g., approximately 0.6 to 0.8 volts below VDD). Alternatively, VREFH may be other voltages. VDD may be any supply voltage. For example, VDD may be from approximately 2.7 volts to approximately 7.0 volts.

The operation of CAM cell 402 may be illustrated as follows. Assume that RAM cell 404 stores a high logic state (a one) at node 428 causing transistor 414 to be on. The cross-coupled nature of inverters 406 and 408 will cause a low logic state (a zero) to be stored at node 430 turning off transistor 420. During a compare operation, if the comparand data is also high (CL 214 high), then CLB 216 will be driven low causing transistor 416 to turn off. Therefore, if there is a match between the comparand data and the data stored by RAM cell 404, match line 204 will remain in a high state. If, however, the comparand data is low (CL 214 low), then CLB 216 is driven high causing transistor 416 to be on and match line 204 to be pulled towards the potential of line 426 via transistors 414 and 416. Therefore, if there is no match between the comparand data and the data stored by RAM cell 404, match line 204 will be pulled to a low state.

Similarly, if RAM cell 404 stores a low logic state at node 428, transistor 414 will be off, and transistor 420 will be on. During a compare operation, if the comparand data is also low, then CL 214 will be driven low causing transistor 418 to turn off. Therefore, if there is a match between the comparand data and the data stored by RAM cell 404, match line 204 will remain in a high state. If, however, the comparand data is high, then CL 214 is driven high causing transistor 418 to be on and match line 204 to be pulled towards the potential of line 426 via transistors 418 and 420. Therefore, if there is no match between the comparand data and the data stored by RAM cell 404, match line 204 will be pulled to a low state.

Because of the separate bit lines and compare lines, CAM cell 400 may perform a comparison operation at the same time that data is read from RAM cell 404. That is, data may be compared on lines CL 214 and CL 216 with nodes 428 and 430 at the same time that data is read from nodes 428 and 430 to BL 210 and BLB 212, respectively. This may be advantageous in performing compare operations in CAM devices such as CAM device 100 of FIG. 1.

With respect to FIG. 2, CAM array 104 may store associative memory data or compare data (e.g., port address, pattern recognition keys, etc.) in any number of CAM cells 202 in a given row of CAM cells. The compare data may be compared with comparand data stored in comparand register 120. Similarly, CAM array 104 may store associated data or RAM data (e.g., bridge or switch port address, access information, or aging data) in any number of CAM cells 202 in a given row of CAM cells. The associated data may correspond to, or be associated with, other CAM cells in the same row that store compare data. The CAM cells 202 may be partitioned with a granularity of one into compare data and associated data segments. The compare data and associated data segments may be interleaved, or they may be non-interleaved segments.

For one embodiment, memory configuration register 106 may be used to program which bits in CAM array 104 are used to store compare data, and which bits are used to store associated data or other information. Memory configuration register 106 may thus act as a mask register indicating which CAM cells 202 (e.g., that may store compare data) will participate in a compare operation with comparand data, and which bits (e.g., that may store associated data or any other information) will not participate in a comparison operation with comparand data. For example, memory configuration register 106 may include one or more programmable bits corresponding to each column of CAM cells in CAM array 104. Each bit may be programmed via CBUS 138.

Data stored in CAM array 104 may be output (e.g., via sense amplifiers 122 and output multiplexer 134) in any order or in any format. For one embodiment, CAM array 104 may output its contents in multi-bit segments. Each segment may store compare data, associated data, and/or other information. For one example, CAM array 104 may be partitioned into four segments of 16 bits each. One or more of the segments may be sensed and output by output multiplexer 134 in any order (e.g., $2^4$ or 16 possible ordered outputs). One or more bits in device configuration register 136 may be programmed via CBUS 138 to cause one or more multiplexers in output multiplexer 134 to output the desired order of the segments to ADS BUS 142. For example, programming a bit in device configuration register 136 may cause a first 16-bit segment to be output on the first sixteen lines of ADS BUS 142, and a second 16-bit segment to be output on the second sixteen lines of ADS BUS 142. For this example, the remaining signal lines of ADS BUS 142 may output a match address and status information as shown in FIG. 10. For another example, programming a bit in device configuration register 136 may cause a third 16-bit segment to be output on the first sixteen lines of ADS BUS 142, and a fourth 16-bit segment to be output on the second sixteen lines of ADS BUS 142.

Figure 5:
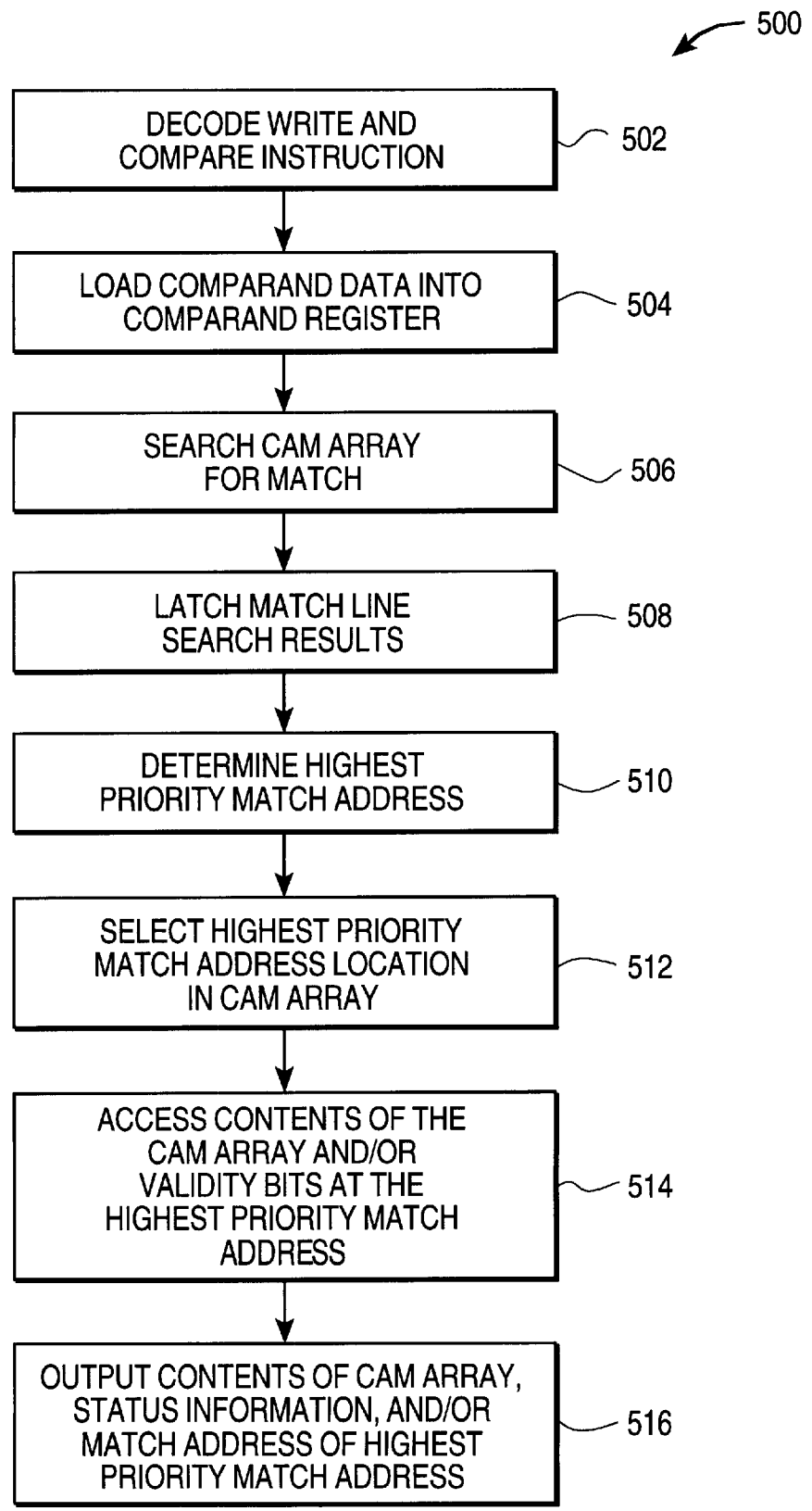
FIG. 5 is one embodiment of a method of performing a write and compare operation in a single clock cycle.

FIG. 5 describes one embodiment 500 of generally performing a write and compare instruction in CAM device 100 in one clock cycle of external clock signal CLK 178. At the start of the clock cycle, instruction decoder 128 decodes the write and compare instruction on IBUS 140 at step 502. In response to the instruction, comparand register 120 loads comparand data from CBUS 138 at step 504. Instruction decoder 128 may include a look-up table, a state machine, or any other control logic that can decode the write and compare or a compare instruction on IBUS 140.

At step 506, the comparand data in comparand register 120 is compared with data stored in CAM array 104 to determine if there is a match. The write and compare instruction decoded by instruction decoder 128 may instruct CAM device 100 to compare the comparand data against all entries, only valid entries (e.g., skip and empty bits inactive), entries where the skip bits are active, or entries where the skip bit and empty bits are active. The write and compare instruction may also instruct CAM device 100 to use one or more mask registers (not shown) to mask certain columns of CAM cells from the comparison. Alternatively, the decoded write and compare instruction may instruct CAM device 100 to compare the comparand data against associated data stored in CAM array 104. The write and compare instruction may be binary encoded on IBUS 140, or may be encoded in any other format. The comparison results of step 506 will be reflected by the state of the match lines 204 in CAM array 104.

At step 508, the states of the match lines in CAM array 104 are latched by match latch 114 and provided to priority encoder 116. At step 510, priority encoder 116 determines the highest priority match address from the comparison. Match latch 114 may be incorporated into priority encoder 116. The match address in then is output by priority encoder 116 to bus 146 and may be latched by address latch 118. Bus 146 couples the match address to output multiplexer 134 and status register 132 for output to ADS BUS 142. As generally known in the art, priority encoder 116 may also generate a match flag signal on line 148 if there is at least one match between the comparand data and the data stored in CAM array 104. Additionally, priority encoder 116 may also generate a multiple match flag signal on line 150 if there is at least two matches between the comparand data and the data stored in CAM array 104.

The match address on bus 162 is provided to address decoder 112 by address selector 110. Address selector 110 couples either the address on address bus 164 or the match address on bus 162 to address decoder 112 in response to a signal on line 166. Address bus 164 may be an internal bus within CAM device 100 (e.g., coupled to an address counter) or a bus external to CAM device 100. Address selector 110 may be a multiplexer. For an alternative embodiment, address selector 110 may be omitted and bus 162 may be directly connected to address decoder 112.

At step 512, address decoder 112 decodes the match address and selects one row of CAM cells in CAM array 104 corresponding to the match address. Address decoder 112 may also select the corresponding validity bits 108 for the selected row in CAM array 104. At step 514, one or more CAM cells at the highest priority match address are sensed by sense amplifiers 122 and coupled to bus 152 for output to ADS BUS 142 via output multiplexer 134. Additionally, the validity bits may be accessed and/or sensed (e.g., by sense amplifiers 122) and output to bus 157. At step 516, and before the end of the first clock cycle of external clock CLK 178, output multiplexer 134 may simultaneously or concurrently output to ADS BUS 142: the data read from CAM array 104 onto bus 152; the match address on bus 146; and/or, the status information (e.g., match flag signal on line 148, multiple match flag signal on line 150, full flag signal on line 156, the validity bits on bus 157, and/or device identification information from device identification register 121 on bus 155). For example, output multiplexer 134 may output the signals as illustrated in FIGS. 10 and 11.

Timing generator 126 outputs timing signals on lines 160, 166, 168, 170, 172, 174, 176, and 182 in response to one or more clock signals from clock buffer 124 and an indication of the write and compare instruction (or simply a compare instruction) from instruction decoder 128 on bus 159. The timing signals coordinate the operation of the various circuit elements to perform the write and compare instruction in one clock cycle.

Figure 6:
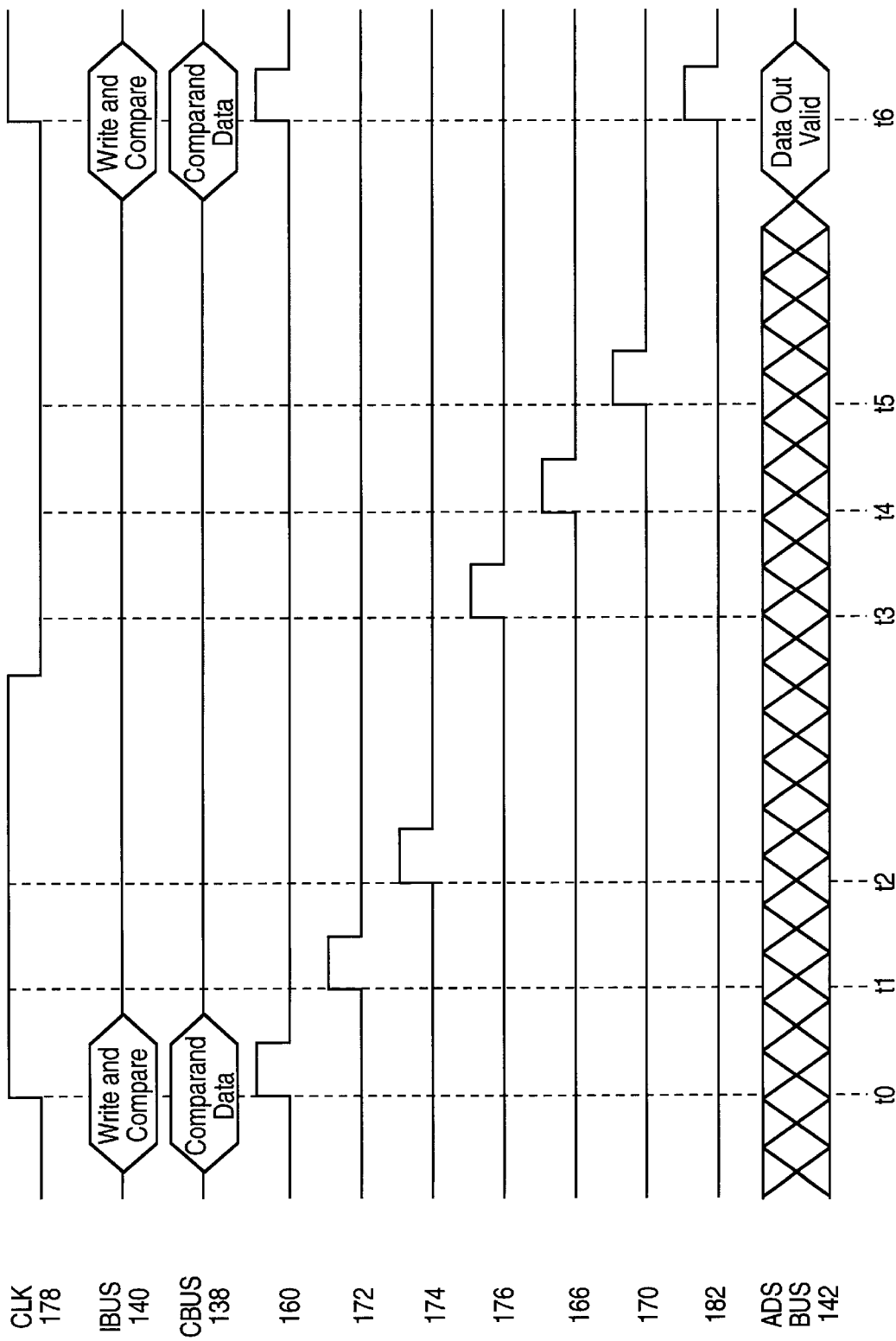
FIG. 6 is a timing diagram for one embodiment of the signals generated by the timing generator of FIG. 1.

FIG. 6 is an illustrative timing diagram showing one embodiment of the sequence of signals generated by timing generator 126 for a write and compare instruction. At time t0, the start of the clock cycle of CLK 178, instruction decoder 128 decodes the write and compare instruction on IBUS 140 and sends a signal on bus 159 to timing generator 126. In response, timing generator 126 sends a pulse signal on line 160 to cause the comparand data on CBUS 138 to be loaded into comparand register 120.

Between times t0 and t1, the comparand data is provided to CAM array 104 and compared against one or more CAM cells of CAM array 104 for a match. The match results reflected on the match lines of CAM array 104 are then coupled to match latch 114 and latched by the pulse generated at time t1 on line 172. The latched match signals are coupled to priority encoder 116.

At time t2, timing generator 126 generates a pulse on line 174 that causes priority encoder 116 to generate a match address for the highest priority matched location. The highest priority match address is output to bus 146. At time t3, timing generator 126 generates a pulse signal on line 176 that causes address latch 118 to latch the match address from priority encoder 116 and provide the latched match address to bus 162.

At time t4, timing generator 126 generates a pulse signal on line 166 that causes optional address selector 110 to couple the match address on bus 162 to address decoder 112. Address decoder 112 may then decode the match address and select the row of CAM cells in CAM array 104 and/or the validity bits 108 that corresponds to the matched address. Address decoder 112 may alternatively be synchronous and start decoding the match address in response to the signal on line 166. Alternatively, address decoder 112 may start decoding the match address in response to a pulse signal on line 168. The pulse signal on line 168 may be generated coincident with the pulse signal on line 166, or after the pulse signal on line 166 but before the pulse signal on line 170.

Between times t4 and t5, sense amplifiers 122 sense the selected CAM cells of CAM array 104 (and/or the corresponding validity bits). At time t5, timing generator 126 then generates a pulse signal on line 170 that causes sense amplifiers 122 to latch the sensed data and couple this data to bus 152. This data may then be output by output multiplexer 134 to ADS BUS 142 by time t6 along with the match address from bus 146 and the status information (e.g., the validity bits 108, the match flag signal from line 148, the multiple match flag signal from line 150, the full flag signal on line 156, and/or the device identification on bus 155). A subsequent instruction (e.g., another write and compare instruction) may then begin at time t6.

Timing generator 126 may additionally generate one or more pulse signals on bus 182 at time t6 that causes status register 132 to load the match address from bus 146, the match flag signal from bus 148, the multiple match flag signal from line 150, the device identification information from bus 155, the sensed data CAM array data on bus 152, the full flag signal from line 156, and/or validity bits 108 from bus 157. The signals on bus 182 may alternatively be generated by instruction decoder 128.

The time differences between the pulses generated on lines 160, 172, 174, 176, 166, 170, and 182 are sufficient to allow the operations described above to function properly under anticipated, characterized, or specified process, temperature, and supply voltage ranges. For one embodiment, the clock cycle time (i.e., t6–t0) is approximately 25 ns, t1–t0 is approximately 4 ns, t2–t1 is approximately 2 ns, t3–t2 is approximately 5 ns, t4–t3 is approximately 2 ns, t5–t4 is approximately 4 ns, and t6–t5 is approximately 3 ns. For other embodiments, the time differences between the pulse signals may be different values.

The signals generated on lines 160, 172, 174, 176, 166, 170, and 182 are shown in FIG. 6 as pulse signals. For alternative embodiments, a rising or falling edge of a signal may be generated instead of a pulse signal. The pulse signals may also be programmable or adjustable to have any pulse width.

Figure 7:
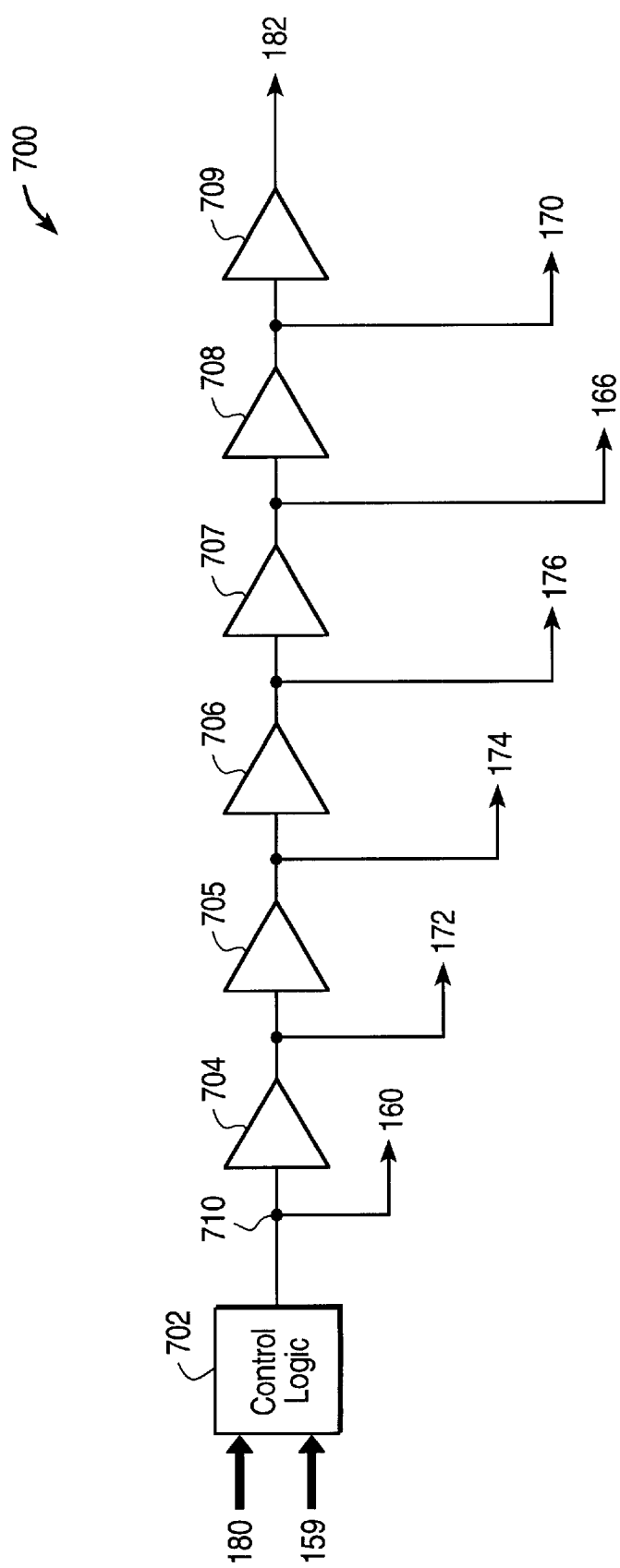
FIG. 7 is one embodiment of the timing generator of FIG. 1.

Timing generator 126 may be any timing generator circuit that generates the pulses on lines 160, 172, 174, 176, 166, 170, and 182 at the appropriate times. FIG. 7 shows timing generator 700 that is one embodiment of timing generator 126 of FIG. 1. Timing generator 700 includes control logic 702 that receives one or more clock signals on bus 180 from clock buffer 124, and an indication of the write and compare instruction from instruction decoder 128 on bus 159. Control logic 702 may be a pulse generator circuit that generates a pulse signal on line 710 that may be coupled to line 160. The pulse signal on line 710 may be delayed by a series of delay elements 704, 705, 706, 707, 708, and 709 that may be used to generate the pulse signals on lines 172, 174, 176, 166, 170, and 182, respectively. Delay elements 704–709 may include, for example, resistors, capacitors, transistor pass gates, inverting buffers, and/or non-inverting buffers. Each delay element may also include a programmable element that enables a user or manufacturer to program the delay of each of the delay elements so that the pulses on lines 172, 174, 176, 166, 170, and 182 may be generated at the appropriate times. The programmable elements may also program the pulse width of one or more of the signals 172, 174, 176, 166, 170, and 182.

For an alternative embodiment, clock buffer 124 may generate a plurality of signals at different times, and timing generator 126 may include circuitry that selectively enables each of the clock signals to be coupled to lines 160, 172, 174, 176, 166, 170, and 182 at the appropriate time.

For still another embodiment, clock buffer 124 may generate a clock signal on bus 180 that has a frequency that is n times the frequency of CLK 178, where n is greater than one. Timing generator 126 may be a state machine or counter that consecutively generates the signals on lines 160, 172, 174, 176, 166, 170, and 182 once per clock cycle of the clock signal on bus 180.

Figure 8:
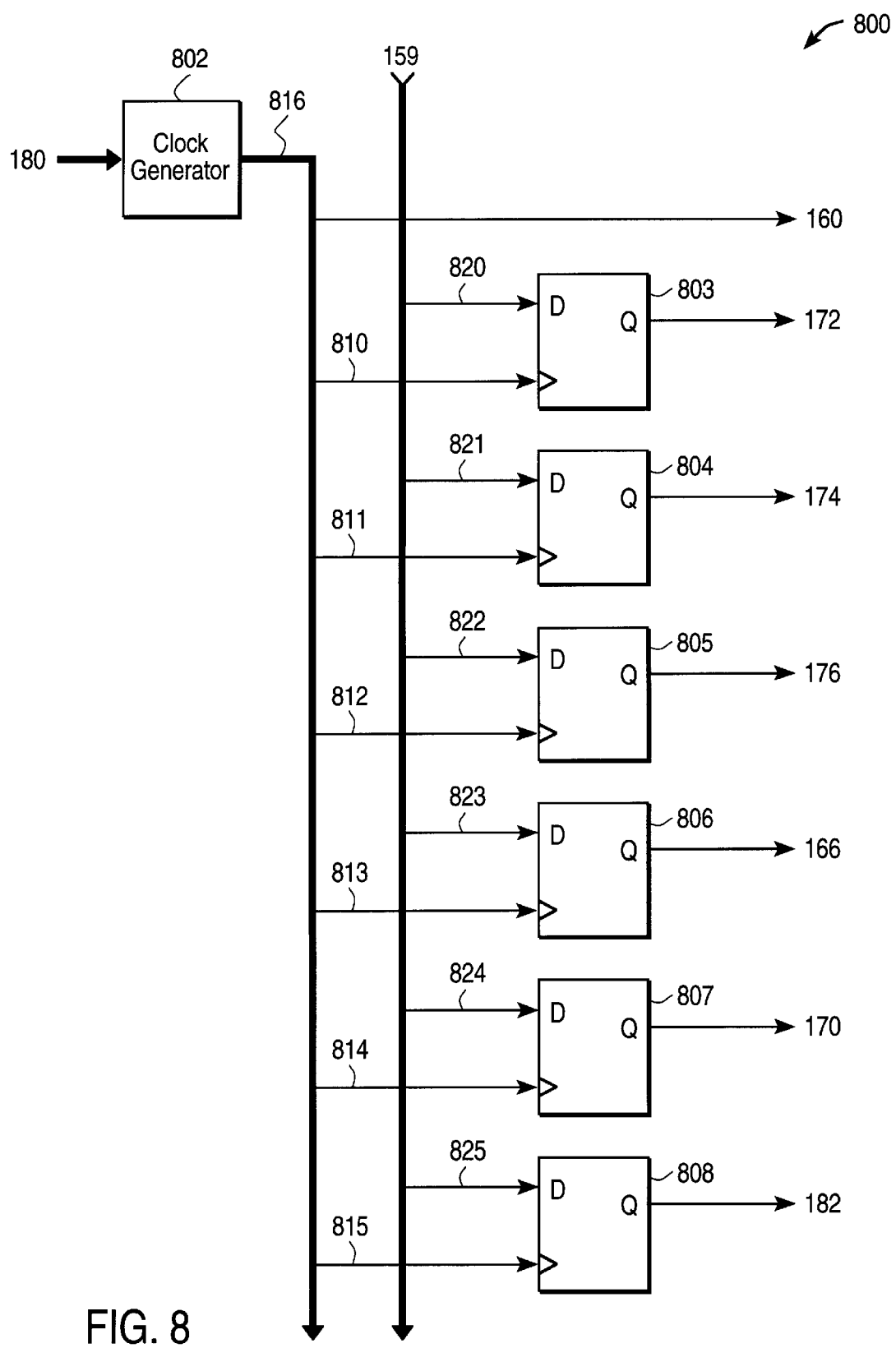
FIG. 8 is another embodiment of the timing generator of FIG. 1.

FIG. 8 illustrates timing generator 800 that is another embodiment of timing generator 126 of FIG. 1. Timing generator 800 includes a clock generator 802 and latches 803–808. Clock buffer 802 generates one or more clock signals on bus 816 in response to one or more buffered clock signals received on bus 180 from clock buffer 124. Alternatively, clock generator 802 may receive CLK 178. The clock signals on bus 816 may be pulse signals or edge transitions, and may be of any pulse width. For one embodiment, the clock signals on bus 816 include pulse signals that are approximately 2 to 6 ns in duration. The clock signals from bus 816 are provided to the clock inputs of latches 803–808. For example, one or more clock signals on lines 810, 811, 812, 813, 814, and 815 are coupled to the clock inputs of latches 803, 804, 805, 806, 807, and 808, respectively. The signals on lines 810–815 may be the same signal or different signals. For one embodiment, the signals on lines 810–815 may be pulse signals that start at the beginning of a clock cycle, the middle of clock cycle, at the end of a clock cycle, or at any other predetermined time within a clock cycle. Latches 803, 804, 805, 806, 807, and 808 may be self-timed latches that generate pulse signals on lines 172, 174, 176, 166, 170, and 182, respectively, in response to data input signals on lines 820–825 and the assertion of clock signals on liens 810–815. Lines 820–825 may be included in bus 159 output by instruction decoder 129 of FIG. 1.

With respect to FIGS. 6 and 8, clock generator 802 may generate the signal on line 160 at time t0. The signal on line 160 may alternatively be generated by a latch device, but it may be advantageous to generate this signal very close to the rising edge transition of CLK 178. For one embodiment, CLK 178 may be provided on line 160. After the write and compare instruction is decoded, instruction decoder 128 may assert signals on lines 820–825 that cause the pulses on lines 172, 174, 176, 166, 170, and 182 to be generated. Latch 803 may latch the signal on line 820 in response to a clock signal on line 810. The signal on line 810 may arrive at time t1, or latch 803 may receive the signal on line 810 earlier and may delay the generation of the signal on line 172 until time t1. Latch 804 may latch the signal on line 821 in response to a clock signal on line 811. The signal on line 811 may arrive at time t2, or latch 804 may receive the signal on line 811 earlier and may delay the generation of the signal on line 174 until time t2. Latch 805 may latch the signal on line 822 in response to a clock signal on line 812. The signal on line 812 may arrive at time t3, or latch 805 may receive the signal on line 812 earlier and may delay the generation of the signal on line 176 until time t3. Latch 806 may latch the signal on line 823 in response to a clock signal on line 813. The signal on line 813 may arrive at time t4, or latch 806 may receive the signal on line 813 earlier and may delay the generation of the signal on line 166 until time t4. Latch 807 may latch the signal on line 824 in response to a clock signal on line 814. The signal on line 814 may arrive at time t5, or latch 807 may receive the signal on line 814 earlier and may delay the generation of the signal on line 170 until time t5. Latch 808 may latch the signal on line 825 in response to a clock signal on line 815. The signal on line 815 may arrive at time t6, or latch 808 may receive the signal on line 815 earlier and may delay the generation of the signal on line 182 until time t6. There may be one or more latches 808 to output one or more signals on one or more lines 182.

The previous embodiments have described a single clock cycle operation of a write and compare instruction. The CAM device 100 of FIG. 1 may also perform a compare instruction in a single cycle. The compare instruction performs the same steps as the write and compare operation described above excluding the additional step of loading the comparand data into comparand register 120.

Figure 9:
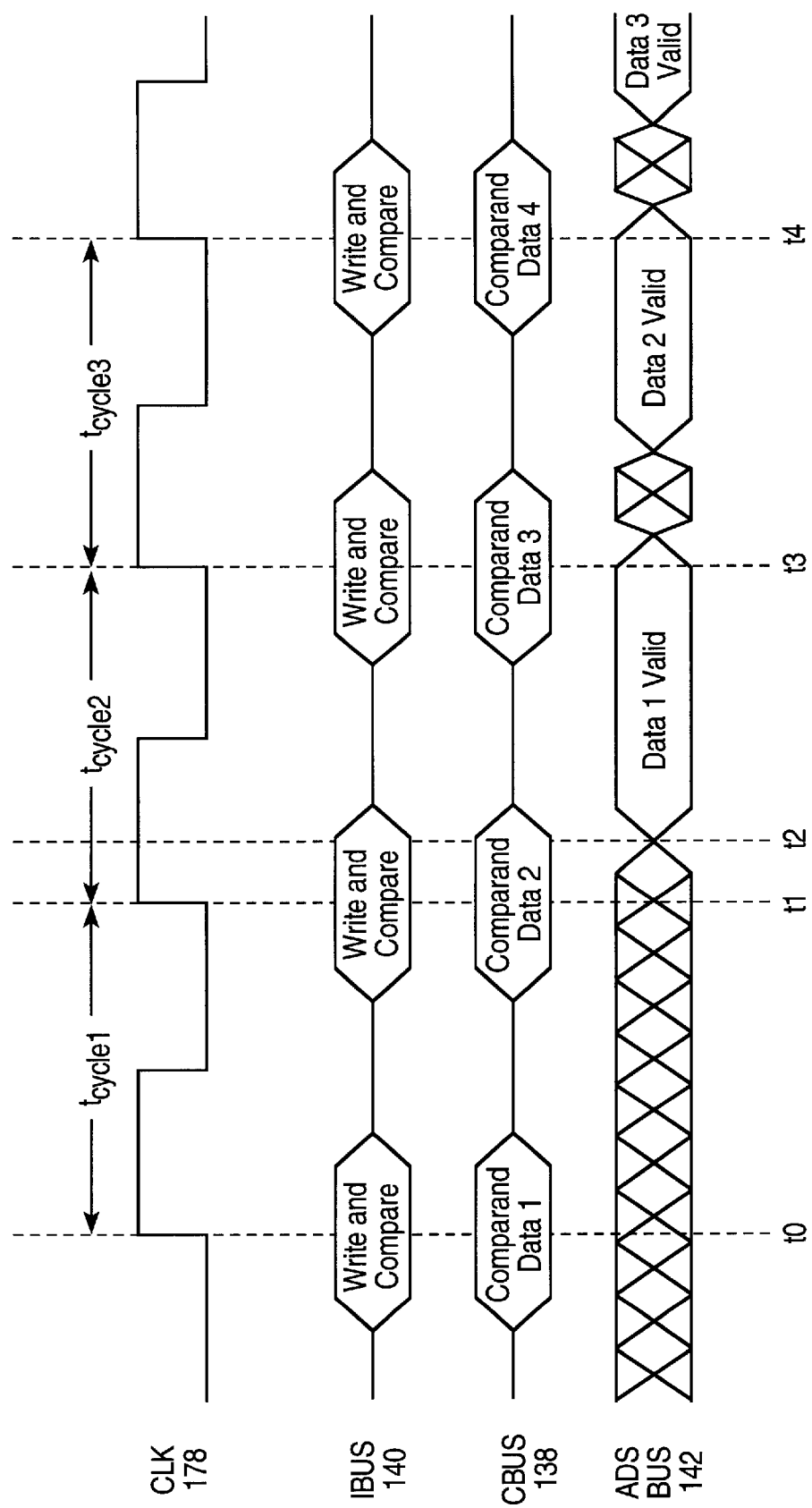
FIG. 9 is a timing diagram illustrating a pipelined mode of operation for the CAM device of FIG. 1.

CAM device 100 may also function in a pipelined mode of operation to take advantage of the fact that CAM device 100 can perform a write and compare instruction (or simply a compare instruction) in a single clock cycle. An example of a pipelined mode of operation is illustrated in FIG. 9. At time t0, a first write and compare instruction is provided to CAM device 100 on bus 140 at the same time that first comparand data is provide on CBUS 138 for comparand register 120. During clock cycle $t_{cycle1}$, all of the steps of the process of FIG. 5 and/or FIG. 6 are performed by CAM device 100. By the end of $t_{cycle1}$, status register 132 receives the match address on bus 146, the match flag signal on line 148, the multiple match flag signal on line 150, the full flag signal on line 156, the device identification information on bus 155, the data read from CAM array 104 on bus 152, and/or validity bits 108 on bus 157. Status register 132 may be updated with this information by one or more signals on bus 182 from timing generator 126 or clock buffer 124.

The rising edge of CLK 178 at time t1 may clock the contents of status register 132 onto ADS BUS 142 via output multiplexer 134 at time t2. Output multiplexer 134 may be configured to output the data from status register 132 rather than bypass the status register 132 by programming one or more bits in configuration register 136. FIG. 10 shows one embodiment of the data output on ADS BUS 142 from status register 132 via output multiplexer 134 when ADS BUS 412 is a 64-bit bus. FIG. 11 shows another embodiment. For alternative embodiments, the data output from status register 132 may be in any other format or order. For yet other embodiments, there may be more than one status register 132 to further pipeline the data to be output to ADS BUS 142.

The time difference between times t1 and t2 may be very fast because it is the time to clock a register element. For one embodiment, the time difference between t1 and t2 may be approximately 2–10 ns. Additionally, the data output to ADS BUS 142 from status register 132 may be valid for a large percentage of the clock cycle time (e.g., approximately 30 percent to approximately 90 percent) as the data will become invalid only at the end of the next clock cycle $t_{cycle2}$.

At the end of clock cycle $t_{cycle1}$ and the start of clock cycle $t_{cycle2}$, a second write and compare instruction (or simply a compare instruction) may be provided on IBUS 140 along with second comparand data on CBUS 138. During clock cycle $t_{cycle2}$, all of the steps of the process of FIG. 5 and/or FIG. 6 are performed by CAM device 100. By the end of $t_{cycle2}$, status register 132 receives the match address on bus 146, the match flag signal on line 148, the multiple match flag signal on line 150, the full flag signal on line 156, the device identification information on bus 155, the data read from CAM array 104 via bus 152, and/or validity bits 108 on bus 152. This information will then be available from status register 132 in clock cycle $t_{cycle3}$.

It will be appreciated that the signals generated by timing generator 126 (e.g., the pulse signals on lines 160, 172, 174, 176, 166, 170, and/or 182) may be generated in response to a transition of CLK 178 or another internal clock signal. It will also be appreciated that the signals generated by timing generator 126 may alternatively occur over more than one clock cycle of CLK 178. Preferably, the signals span less than three clock cycles of CLK 178. For example, in the first clock cycle of CLK 178 the pulses on lines 160, 172, 174 and/or 176 may be generated; and, in the second clock cycle of CLK 178 the pulses on lines 166, 170, and/or 182 may be generated. For yet another embodiment, CLK 178 may run at a higher or lower frequency than an internal clock signal that may be used to start the sequence of pulse signals output by timing generator 126.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of reading data from a synchronous content addressable memory (CAM) device, comprising:
   instructing the CAM device to compare comparand data with data stored in a plurality of first CAM cells;
   comparing the comparand data with the data stored in each of the plurality of first CAM cells;
   sensing data stored in a second CAM cell; and
   outputting the sensed data from the CAM device, wherein the instructing, comparing, sensing, and outputting occur in less than three clock cycles.

2. The method of claim 1, further comprising determining a match address for at least one of the plurality of first CAM cells storing data matching the comparand data.

3. The method of claim 2, wherein the sensing further comprises outputting status information corresponding to the at least one of the plurality of first CAM cells storing data matching the comparand data.

4. The method of claim 1, wherein the instructing, comparing, sensing and outputting occur in the same clock cycle.

5. A method of reading data from a synchronous content addressable memory (CAM) device, comprising:
   instructing the CAM device to compare comparand data with data stored in a plurality of first CAM cells;
   comparing the comparand data with the data stored in the plurality of first CAM cells;
   determining a match address for at least one of the plurality of CAM cells storing data matching the comparand data; and
   outputting the match address from the CAM device, wherein the instructing, comparing, determining, and outputting occur in less than three clock cycles.

6. The method of claim 5, wherein the instructing, comparing, determining and outputting occur in the same clock cycle.

7. A method of reading data from a synchronous content addressable memory (CAM) device, comprising:
   instructing the CAM device to compare comparand data with data stored in a plurality of first CAM cells;
   comparing the comparand data with the data stored in the plurality of first CAM cells;
   determining that the comparand data matches data stored in one of the plurality of first CAM cells;
   sensing validity information from a second CAM cell, wherein the second CAM cell corresponds to the one of the plurality of first CAM cells storing data that matches the comparand data; and
   outputting the validity information from the CAM device, wherein the instructing, comparing, determining, sensing, and outputting occur in less than three clock cycles.

8. The method of claim 7, wherein the validity information comprises a skip bit.

9. The method of claim 7, wherein the validity information comprises an empty bit.

10. The method of claim 7, wherein the instructing, comparing, determining, sensing and outputting occur in the same clock cycle.

11. A method of reading data from a synchronous content addressable memory (CAM) device, comprising:
   instructing the CAM device to compare comparand data with data stored in a plurality of first CAM cells;
   comparing the comparand data with the data stored in the plurality of first CAM cells;
   sensing data stored in a second CAM cell;
   loading the sensed data into a status register, wherein the instructing, comparing, sensing, and loading all occur in a first clock cycle; and
   outputting the sensed data from the status register in a second clock cycle.

12. The method of claim 11, further comprising the determining a match address for at least one of the plurality of first CAM cells storing data matching the comparand data, wherein the loading further comprises loading the match address into the status register in the first clock cycle.

13. The method of claim 12, further comprising outputting the sensed data and the match address from the status register in a second clock cycle.

14. A method of reading data from a synchronous content addressable memory (CAM) device, comprising:

instructing the CAM device to compare comparand data with data stored in a plurality of CAM cells;

comparing the comparand data with the data stored in the plurality of CAM cells;

determining a match address for at least one of the plurality of CAM cells storing data matching the comparand data;

loading the match address into a status register, wherein the instructing, comparing, determining, and loading all occur in a first clock cycle; and outputting the match address from the storage element in a second clock cycle.

* * * * *